United States Patent
Ishii et al.

(10) Patent No.: US 9,324,679 B2
(45) Date of Patent: Apr. 26, 2016

(54) TWO-SHAFT DRIVE MECHANISM AND DIE BONDER

(75) Inventors: Yoshihide Ishii, Kumagaya (JP); Masayuki Mochizuki, Kumagaya (JP); Yoshihiro Kurihara, Kumagaya (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 601 days.

(21) Appl. No.: 13/587,101

(22) Filed: Aug. 16, 2012

(65) Prior Publication Data
US 2013/0221764 A1    Aug. 29, 2013

(30) Foreign Application Priority Data

Feb. 29, 2012    (JP) ................................. 2012-042896

(51) Int. Cl.
*B29C 65/48* (2006.01)
*H01L 23/00* (2006.01)

(52) U.S. Cl.
CPC ....... *H01L 24/75* (2013.01); *H01L 2224/75702* (2013.01)

(58) Field of Classification Search
CPC ...... B29C 65/48; B29C 65/52; B29C 66/836; B29C 66/863; B29C 66/92; B29C 66/922; B29C 66/9231; B29C 66/92311; B32B 37/12; B32B 41/00; B65G 47/74; B65G 47/901; B65G 47/902; G05B 9/02; H01L 24/75; H01L 2224/75702
USPC ......... 156/358, 367, 368, 378, 538, 540, 578, 156/584; 318/563; 414/749.1, 749.2, 751.1, 414/752.1
See application file for complete search history.

(56) References Cited

U.S. PATENT DOCUMENTS

| 5,830,297 A | * | 11/1998 | Nakahira et al. ................. 156/64 |
| 5,876,556 A | * | 3/1999 | Takanami ...................... 156/556 |
| 8,460,491 B1 | * | 6/2013 | Fukasawa et al. .............. 156/64 |

(Continued)

FOREIGN PATENT DOCUMENTS

| JP | 2000-3920 A | 1/2000 |
| JP | 2004-71818 A | 3/2004 |

(Continued)

OTHER PUBLICATIONS

Translation of JP 2004-263825 A, Published Sep. 2004, Inventor Sueda, Tetsuya.*
Korean Office Action dated Mar. 26, 2014 (Five (5) pages).

*Primary Examiner* — George Koch
(74) *Attorney, Agent, or Firm* — Crowell & Moring LLP (57) ABSTRACT

A two-shaft drive mechanism includes a processing unit, a first linear motor provided with a first movable portion and a first fixed portion, which elevates the processing unit along a first linear guide, and a second linear motor provided with a second movable portion and a second fixed portion, which moves the processing unit in a horizontal direction vertical to the direction for elevating the processing unit, a support body that fixes the first fixed portion, a second linear guide that is provided between the support body and the second fixed portion, and allows the second fixed portion to freely move, and a control unit that controls a position of the first movable portion in the horizontal direction based on an output of the linear sensor that detects a position of the first movable portion in a horizontal direction with respect to the support body.

17 Claims, 6 Drawing Sheets (56) References Cited

U.S. PATENT DOCUMENTS

2004/0083966 A1   5/2004  Takahashi et al.
2009/0201484 A1*  8/2009  Arai ............................. 355/72
2013/0014881 A1*  1/2013  Fukasawa et al. ............ 156/60
2013/0014904 A1*  1/2013  Hosaka et al. ............... 156/578

FOREIGN PATENT DOCUMENTS

JP    2004263825 A  *  9/2004
JP    2010-177310 A     8/2010

* cited by examiner

TWO-SHAFT DRIVE MECHANISM AND DIE BONDER

BACKGROUND OF THE INVENTION

The present invention relates to a two-shaft drive mechanism that includes an elevating shaft, and a die bonder, and more particularly, to a die bonder with high productivity while aiming at high speed operation of a bonding head as the two-shaft drive mechanism with the elevating shaft.

A die bonder as one of the semiconductor manufacturing apparatuses is configured to bond a semiconductor chip (die) to a substrate such as a lead frame. The die bonder allows the bonding head to perform vacuum suction of the die, ascend at high speed, horizontally move, and descend for mounting the die onto the substrate. An elevating (Z) drive shaft in the aforementioned case allows the ascending and descending operations.

Recently, the demand for high accuracy and high-speed operation of the die bonder has been increased, especially, high-speed operation of the bonding head as the heart of the bonding process has been highly demanded.

Generally, as the operation speed of the apparatus becomes higher, vibration caused by the object that moves at high speeds is increased. Such vibration may impede establishment of the intended accuracy of the apparatus.

JP-A 2000-3920 discloses the technology as the solution for the aforementioned problem that the linear motor is employed as the drive shaft of the semiconductor manufacturing apparatus such as the die bonder to move the permanent magnet and the coil part in opposite directions so as to reduce the vibration and return the permanent magnet part to the original position using a damper.

SUMMARY OF THE INVENTION

JP-A No. 2000-3920 discloses the technology that uses the linear motor as the drive shaft in a plane, but it does not disclose the technology capable of accelerating the operation speed while reducing vibration in the two-shaft drive mechanism using the linear motor for the elevating shaft. If the linear motor drive is simply employed, the stator and needle of the Z axis linear motor for Z-axis drive may exert the load in a horizontal direction, for example, the load to a Y drive shaft in the Y direction to be described later. Increase in the torque of the Y drive shaft may make power consumption and vibration larger. Decrease in weights of the stator and the needle of the linear motor for the Z axis drive may make the torque of the Z axis smaller, thus failing to realize the predetermined high speed operation. The use of the damper that returns the permanent magnet to the original position may complicate the structure.

The present invention provides a two-shaft drive mechanism that includes a Z (elevating) shaft capable of reducing vibration caused by the Y (horizontal) shaft with the simple structure, and a die bonder using the two-shaft drive mechanism.

The present invention further provides the two-shaft drive mechanism that includes the Z (elevating) shaft capable of realizing high speed operation of the elevating shaft, and reducing the vibration caused by the Y (horizontal) shaft, and the die bonder using the two-shaft drive mechanism.

The present invention is configured to achieve the aforementioned objects as at least following characteristics.

As the first characteristic, the present invention includes a processing unit, a first linear motor provided with a first movable portion and a first fixed portion, which elevates the processing unit along a first linear guide, and a second linear motor provided with a second movable portion and a second fixed portion, which moves the processing unit in a horizontal direction vertical to the direction for elevating the processing unit, a support body that fixes the first fixed portion, a second linear guide that is provided between the support body and the second fixed portion, and allows the second fixed portion to freely move, a linear sensor that detects a position of the first movable portion in a horizontal direction with respect to the support body, and a control unit that controls a position of the first movable portion in the horizontal direction based on an output of the linear sensor.

As the second characteristic, the present invention includes a connection portion that connects the first movable portion and the second movable portion directly or indirectly via the first linear guide, and a third linear guide that moves the first movable portion, the second movable portion and the connection portion integrally in the horizontal direction.

As the third characteristic of the present invention, the first movable portion is provided in a direction vertical to the second movable portion, and the second linear guide and the third linear guide are provided parallel to each other.

As the fourth characteristic of the present invention, the second linear guide is identical to the third linear guide.

As the fifth characteristic of the present invention, the first movable portion is provided parallel to the second movable portion, and the first fixed portion is provided parallel to the second fixed portion.

As the sixth characteristic of the present invention, a fourth linear guide is provided between the support body that fixes the second linear guide and the connection portion.

As the seventh characteristic of the present invention, a magnet formed by arranging a plurality of pairs of N-poles and S-poles alternately on the first movable portion in the elevating direction is provided on a predetermined region in the horizontal direction.

As the eighth characteristic, the processing unit of the two-shaft drive mechanism as described in the first to the seventh characteristics processes with respect to a substrate.

As the ninth characteristic of the present invention, the processing unit is a bonding head that picks up a die from a wafer, and bonds the die to the substrate, or a needle used for applying a die adhesive agent to the substrate.

As the tenth characteristic of the present invention, the predetermined region as described in the seventh characteristic includes a pickup region and a bonding region.

The present invention provides the two-shaft drive mechanism which includes the Z (elevating) shaft capable of reducing the vibration caused by the Y (horizontal) shaft with a simple structure, and a die bonder using the two-shaft drive mechanism.

The present invention further provides the two-shaft drive mechanism which includes the Z (elevating) shaft capable of realizing high speed operation of the elevating shaft, and reducing the vibration caused by the Y (horizontal) shaft, and the die bonder using the two-shaft drive mechanism.

DESCRIPTION OF THE PREFERRED EMBODIMENTS

Embodiments according to the present invention will be described referring to the drawings.

Figure 1:
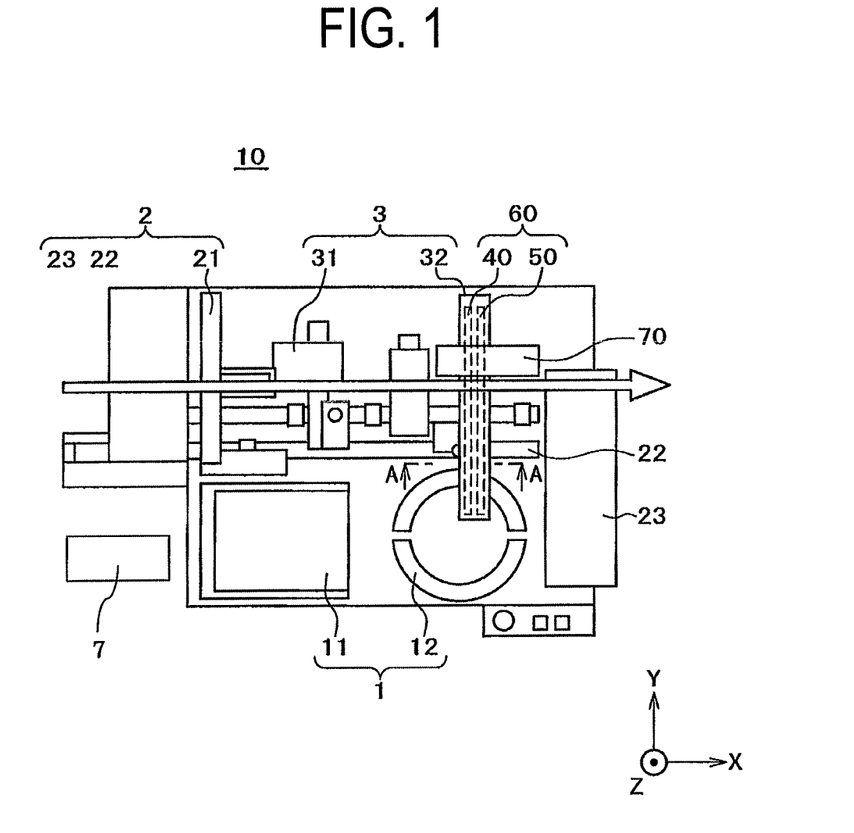
FIG. 1 is a conceptual view of a die bonder as an embodiment of the present invention when seen from above.

FIG. 1 is a conceptual view of a die bonder 10 according to an embodiment of the present invention when seen from above. The die bonder is mainly formed of a wafer supply unit 1, a work supply/conveyance unit 2, a die bonding unit 3, and a control unit 7 that monitors conditions of those units for controlling.

The wafer supply unit 1 includes a wafer cassette lifter 11 and a pickup device 12. The wafer cassette lifter 11 includes a wafer cassette (not shown) loaded with wafer rings which are sequentially supplied to the pickup device 12. The pickup device 12 moves the wafer rings so that the desired die is picked up therefrom.

The work supply/conveyance unit 2 includes a stack loader 21, a frame feeder 22 and an unloader 23, and conveys a work (substrate such as a lead frame) in an arrowed direction. The stack loader 21 supplies the work to which the die is adhered to the frame feeder 22. The frame feeder 22 conveys the work to the unloader 23 via two processing positions on the frame feeder 22. The unloader 23 stores the conveyed work.

The die bonding unit 3 includes a preform unit (die paste application unit) 31 and a bonding head unit 32. The preform unit 31 applies a die adhesive agent to the work, for example, the lead frame conveyed by the frame feeder 22 using the needle. The bonding head unit 32 ascends while picking up the die from the pickup device 12 so as to move the die to a bonding point on the frame feeder 22. The bonding head unit 32 descends the die at the bonding point so that the die is bonded onto the work to which the die adhesive agent is applied.

The bonding head unit 32 includes a ZY drive shaft 60 that elevates the bonding head 35 (see FIG. 2) in a Z (height) direction, and moves the bonding head in a Y direction, and an X drive shaft 70 for movement in an X direction. The ZY drive shaft 60 includes a Y drive shaft 40 that reciprocates the bonding head between a pickup position in the pickup device 12 and the bonding point in the Y direction, and a Z drive shaft 50 that elevates the bonding head for pickup of the die from the wafer or bonding the die to the substrate. The X drive shaft 70 moves the ZY drive shaft 60 as a whole toward the X direction in which the work is conveyed. The X drive shaft 70 may be configured to drive the ball screw using a servo motor, or to have the structure of the ZY drive shaft 60 for driving by the use of a linear motor to be explained later.

Figure 2:
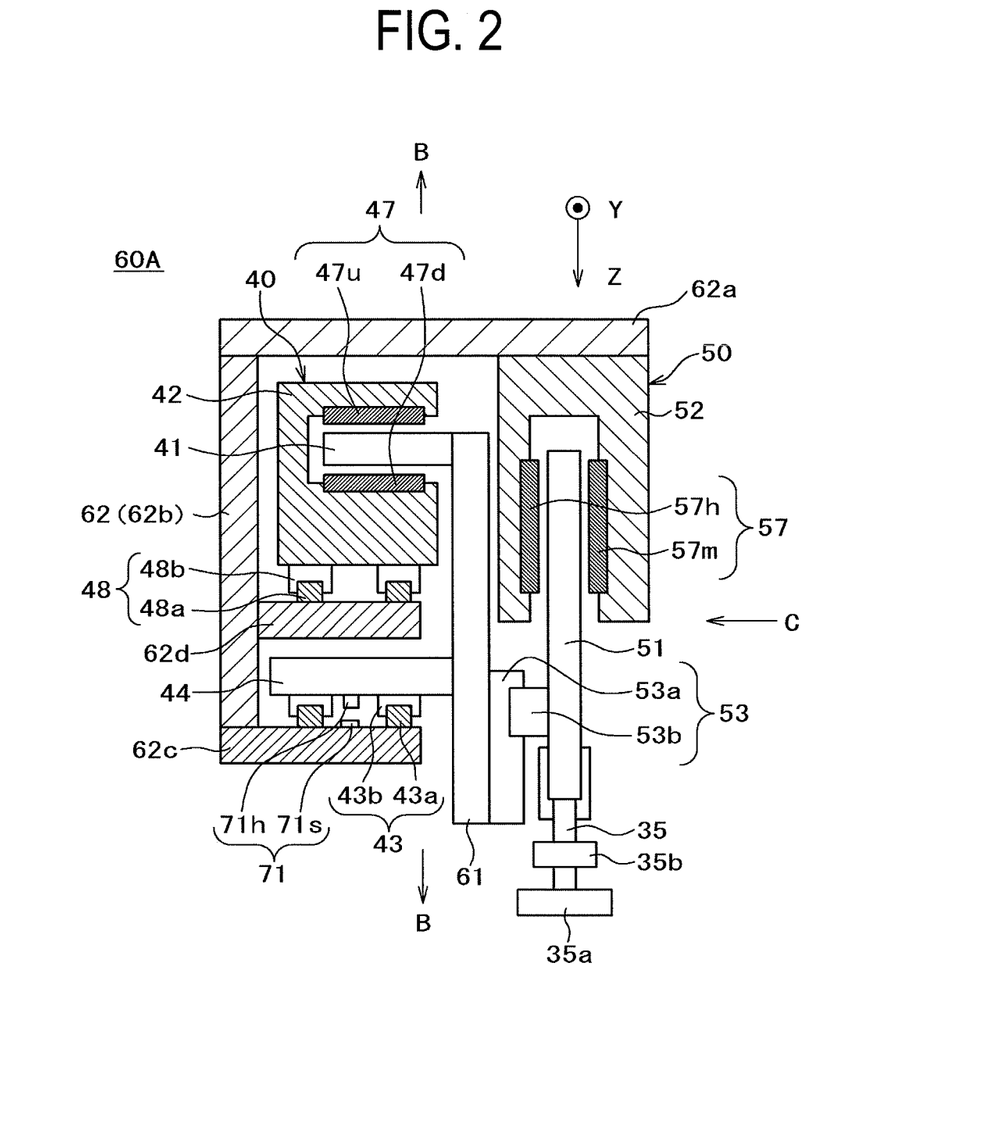
FIG. 2 is a sectional view of a position of a ZY drive shaft where a bonding head exists, taken along line A-A of FIG. 1.
Figure 3:
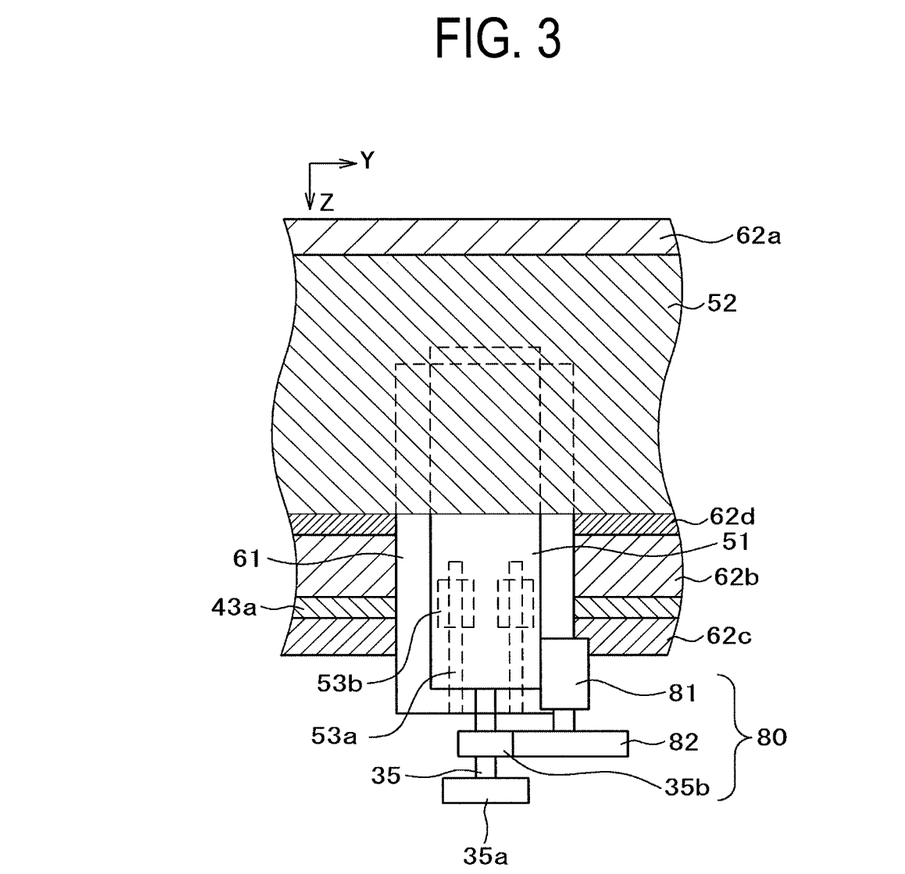
FIG. 3 is an arrow view of the ZY drive shaft shown in FIG. 2 when seen from an arrow mark C.
Figure 4:
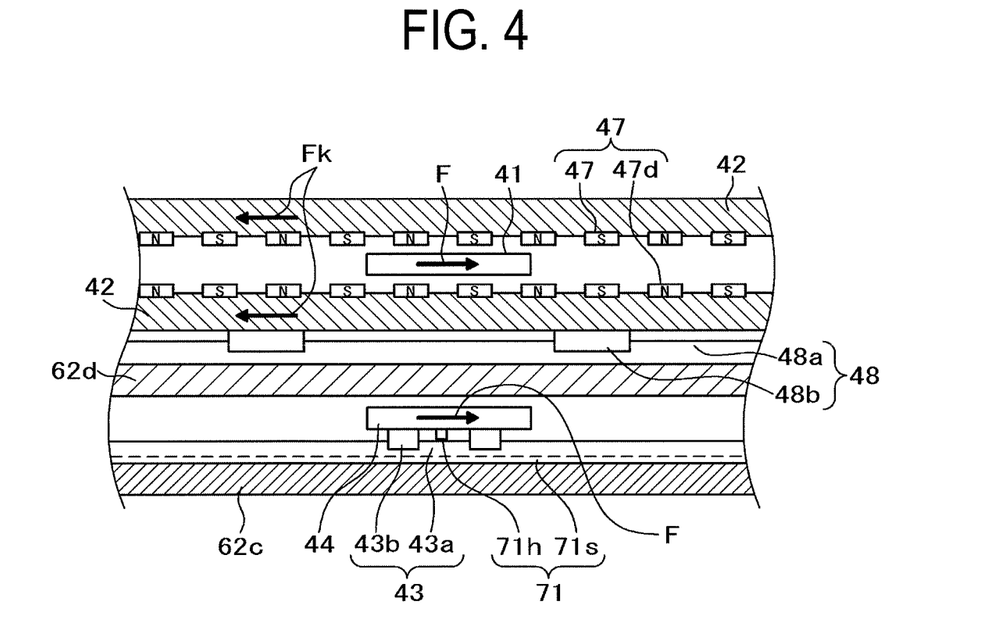
FIG. 4 is a sectional view taken along line B-B shown in FIG. 2, representing a concept of suppressing vibration caused by the Y drive shaft according to the embodiment.

An embodiment of the ZY drive shaft 60 according to the present invention will be described referring to the drawings. FIGS. 2 to 4 represent a basic structure of a ZY drive shaft 60A as a first embodiment. FIG. 2 is a sectional view of the ZY drive shaft 60A where the bonding head 35 exists, taken along line A-A of FIG. 1. FIG. 3 is an arrow view of the ZY drive shaft 60A shown in FIG. 2 when seen from a direction of arrow C. FIG. 4 is a sectional view taken along line B-B of FIG. 2, representing a concept of suppressing vibration caused by the Y drive shaft according to the embodiment.

The ZY drive shaft 60A according to the first embodiment includes the Y drive shaft 40, the Z drive shaft 50, a connection portion 61 that connects a Y shaft movable portion 41 of the Y drive shaft 40 and a Z shaft movable portion 51 of the Z drive shaft 50, the bonding head 35 as a processing unit, a rotation drive unit 80 that rotates the bonding head 35 around the Z axis, and a laterally L-like support body 62 that supports those elements. FIGS. 2 and 3 illustrate the white part that includes the Y shaft movable portion 41, the Z shaft movable portion 51 and the connection portion 61 which integrally move, and the shaded part that includes the other parts fixed to the support body 62 for the purpose of making the following explanation comprehensible. The support body 62 includes an upper support body 62a, a side support body 62b, a lower support body 62c, and a Y drive shaft support body 62d.

Figure 5:
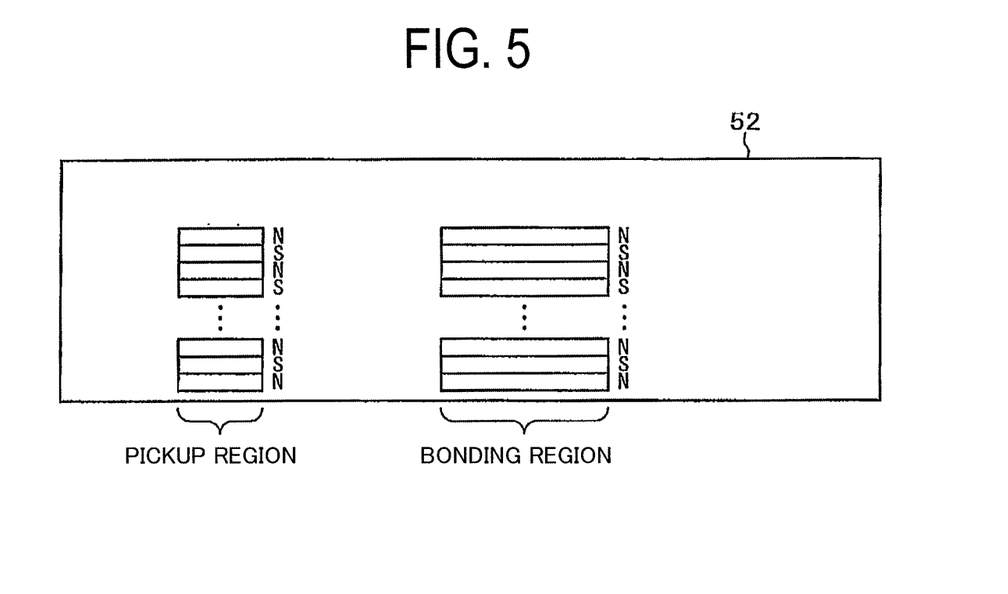
FIG. 5 is a view schematically representing an example of a structure of a fixed magnet portion that allows elevation of the bonding head at a predetermined position.

The Y drive shaft 40 includes an inverse U-like Y shaft fixed portion 42 provided with upper and lower fixed magnet portions 47 (47u and 47d) each obtained by alternately arranging a large number of both N-pole and S-pole permanent magnets in the Y direction as shown in FIG. 5, and a Y shaft fixed linear guide 48 which is provided between the Y shaft fixed portion and the Y drive shaft support portion 62d, and capable of moving the Y shaft fixed portion 42 in the Y direction.

The Y drive shaft 40 includes the Y shaft movable portion 41 which has at least a pair of N-pole and S-pole electromagnets in the arrangement direction, and is inserted into a concave portion of the inverse U-like shape while moving therein, a Y shaft guide portion 44 which is fixed to the connection portion 61 that supports the Y shaft movable portion 41, and includes a Y shaft linear guide 43 provided between the connection portion and the lower support body 62c, and a linear sensor 71 that detects a position of the Y shaft guide portion, that is, the bonding head 35 in the Y direction to be described later.

The Y shaft fixed portion 42 is provided over substantially an entire region of the Y drive shaft 40 as indicated by a broken line of FIG. 1 so that the Y shaft movable portion 41 is movable in a predetermined range. The Y shaft fixed linear guide 48 and the Y shaft linear guide 43 include two linear rails 48a, 43a extending in the Y direction, and linear sliders 48b, 43b movable on the linear rails, respectively. The linear sensor 71 includes a scale 71s provided over substantially an entire region of the Y drive shaft 40, and an optical detection portion 71h that is fixed to the Y shaft guide portion 44 and movable in the Y direction.

In the embodiment, the Y shaft fixed linear guide 48 is provided apart from the Y shaft linear guide 43. It is possible to allow the Y shaft linear guide 43 to serve as the Y shaft fixed linear guide 48 so long as it is provided while avoiding interference between the respective linear sliders 48b and 43b.

The Z drive shaft 50 includes the inverse U-like Z shaft fixed portion 52 with left and right fixed magnet portions 57h and 57m (see FIG. 4, hereinafter simply designated with the reference numeral 57 when indicating the general structure, or the position is not specified), which are obtained by arranging a large number of the N-pole and S-pole electromagnets alternately in the Z direction likewise the Y drive shaft 40, the Z shaft movable portion 51 having at least a pair of N-pole and S-pole electromagnets at the upper portion in the arrangement direction of the Z shaft fixed portion 52, while being inserted into the concave portion of the inverse U-like shape for movement therein, and the Z shaft linear guide 53 having the same structure as that of the Y shaft linear guide 43, which is provided between the Z shaft movable portion 51 and the connection portion 61.

The Z shaft linear guide 53 includes two linear rails 53a fixed to the connection portion 61 and extending in the Z direction, and linear sliders 53b fixed to the Z shaft movable portion 51 for movement on the linear rails. The Z shaft movable portion 51 is linked with the Y shaft movable portion 41 via the connection portion 61. Along with movement of the Y shaft movable portion 41 in the Y direction, the Z shaft movable portion 51 moves in the Y direction. The Z shaft movable portion 51 (bonding head 35) has to be allowed to elevate at a predetermined position of the destination.

The bonding head 35 has its leading end provided with a collet 35a for suction of die, and is rotatably attached to a leading end of the Z shaft movable portion 51 by the rotation drive unit 80 via a gear 35b. The rotation drive unit 80 controls the rotation posture of the bonding head 35 by a motor 81 fixed to the Z shaft movable portion 51 via gears 82 and 35b.

The method of suppressing vibration caused by driving the Y drive shaft 40 that moves the bonding head 35 in the Y direction will be described referring to FIG. 4.

A movable integrated portion that integrally moves with the Y shaft movable portion 41 serves as the load to the Y drive shaft 40. Referring to FIG. 2, the movable integrated portion includes the Y shaft movable portion 41, the connection portion 61, the Y shaft guide portion 44, the Z shaft movable portion 51, the Z shaft linear guide 53, the bonding head 35 and the rotation drive unit 80 (see FIG. 3).

When the movable integrated portion is driven by the Y drive shaft 40 under the driving force F in the arrow direction F shown in FIG. 4, a reaction force Fk (=F) is applied to the fixed magnet portion 47. If the Y shaft fixed portion 42 is fixed to the support body 62, the reaction force Fk generates vibration at the side of the Y shaft fixed portion. The vibration causes the movable integrated portion to vibrate, thus deteriorating the positioning accuracy of the bonding head 35.

For this, the Y shaft fixed linear guide 48 is provided in the support body 62 so that the fixed integrated portion that moves integrally with the Y shaft fixed portion 42 is moved as a counter weight in the Y direction. This makes it possible to suppress the vibration by offsetting the vibrations. In the embodiment, the fixed integrated portion includes the Y shaft fixed portion 42, the fixed magnet portion 47, and the linear slider 48b.

Assuming that each mass of the movable integrated portion and the fixed integrated portion is set to Mm and Mf, respectively, the equation (1) for the respective acceleration values $\alpha m$ and $\alpha f$ is obtained as described below. Each value of the accelerations $\alpha m$, $\alpha f$, speeds Vm, Vf derived from the acceleration, and moving distances Lm, Lf may take the values in inverse proportion to the respective mass values.

$$\alpha f \times Mf = \alpha m \times Mm \quad (1)$$

Referring to FIG. 1, as the Y shaft fixed portion 42, that is, the fixed integrated portion is provided over substantially an entire region of the Y drive shaft 40, the mass Mf of the fixed integrated portion becomes larger than the mass Mm of the movable integrated portion. Accordingly, the movable integrated portion and the fixed integrated portion move in opposite directions, and the moving distance of the movable integrated portion becomes larger. Therefore, the bonding head 35 is movable in the predetermined direction. Assuming that the equation of Mf/Mm=10 is established, the bonding head 35 proceeds rightward by 10, and the fixed integrated portion proceeds in the opposite direction by 1 as shown in FIG. 4. Therefore, the bonding head 35 is allowed to move rightward by 9 with respect to the support body 62. The movement to the destination may be regulated through position control or speed control based on the output of the linear sensor 71. The aforementioned control is executed by the control unit 7.

As described above, in the embodiment, the Y shaft fixed linear guide 48 is simply provided without adding the damper so as to allow the fixed integrated portion to move freely with no limitation. As a result, the movable integrated portion and the fixed integrated portion are operated in synchronization with each other, which requires no control of vibration suppression. This makes it possible to reduce the vibration generated by driving the Y drive shaft 40.

FIG. 5 is a view schematically showing an example of structures of left and right fixed magnets 57 (57h, 57m) capable of elevating the bonding head 35 at the predetermined position. In this example, thin and long N-poles and S-poles are alternately arranged in the Y direction at least in the bonding region and the pickup region. The thin and long N-poles and S-poles may be divided into the short pieces, respectively. It is also possible to alternately provide the thin and long N-poles and S-poles which extend over an entire region in the Y direction.

For the ZY drive shaft 60A according to the first embodiment as described above, the Z shaft fixed portion 52 is provided over substantially an entire region. Compared with the structure shown in FIG. 7, the Z shaft fixed portion 52 as the weight object does not move by itself, and accordingly, the load to the movement in the Y direction is largely reduced. This makes it possible to realize the high speed operation of the elevating shaft without increasing the torque of the horizontal drive shaft.

For the ZY drive shaft 60A according to the first embodiment, the Y shaft fixed linear guide 48 is provided so that the fixed integrated portion mainly formed of the Y shaft fixed portion 42 is freely movable in the Y direction. This makes it possible to suppress vibration by offsetting vibrations of the movable integrated portion and the fixed integrated portion, thus improving accuracy of positioning the bonding head 35.

Figure 6:
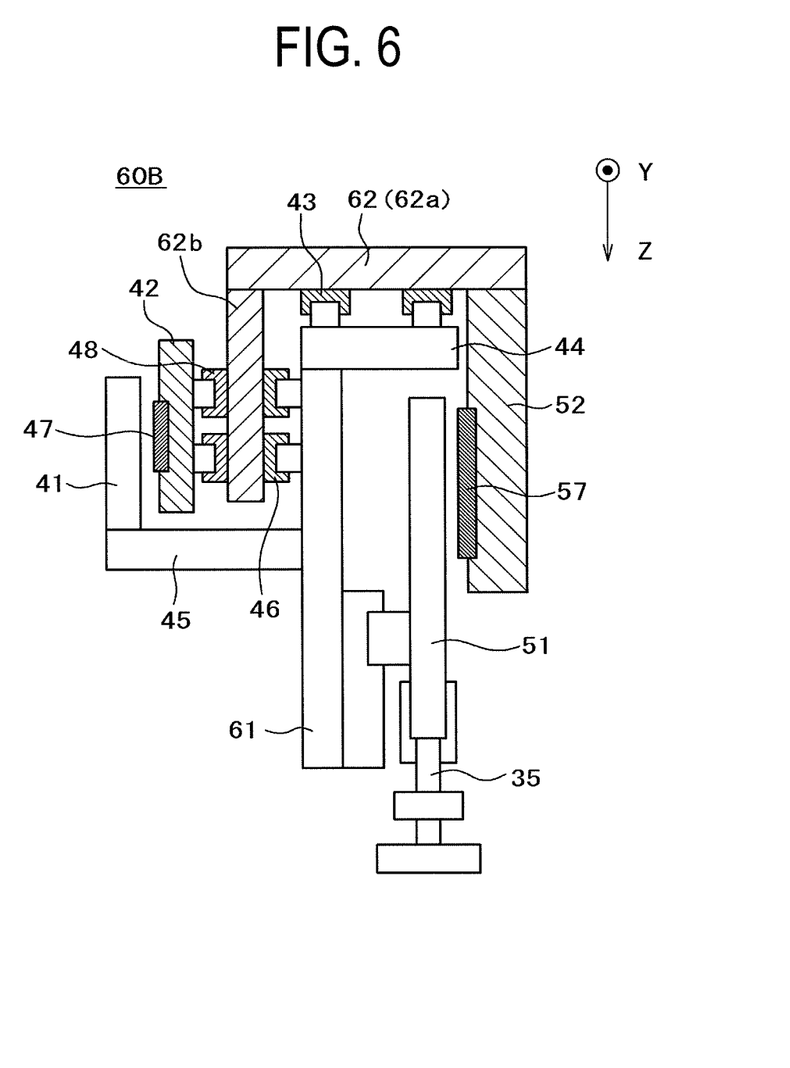
FIG. 6 is a view illustrating a basic structure of a ZY drive shaft 60B according to a second embodiment.

FIG. 6 is a view showing a basic structure of a ZY drive shaft 60B according to a second embodiment. Basically, referring to FIG. 6, the structures or functions similar to those of the first embodiment will be designated with the same codes.

A ZY drive shaft 60B is different from the ZY drive shaft 60A according to the first embodiment in the following points. First, the Y shaft fixed portion 42 is formed to be I-shaped extending in the Z direction, and the Y shaft movable portion 41 is provided parallel to the Y shaft fixed portion 42. Second, the fixed magnet portion for the Y shaft 47 is only provided at one side. Third, the Y shaft movable fixed portion 45 is provided between the Y shaft movable portion and the connection portion 61 for fixing the Y shaft movable portion 41. Fourth, the length of the side support body 62b is reduced, and has one side provided with the Y shaft fixed portion linear guide 48 that makes the Y shaft fixed portion 42 movable.

Fifth, the Y shaft guide portion 44 that supports the Y shaft linear guide 43 which allows the Y shaft movable portion 41 to move in the Y direction has been moved from the lower support body 62c to the upper support body 62a. Sixth, the Z shaft fixed portion 52 that is U-shaped is formed to be I-shaped, and the fixed magnet portions 57h and 57m are replaced with the fixed magnet portion 57 at one side only. Seventh, the linear guide 46 is provided between the side support body 62b and the connection portion 61 for the purpose of preventing the lateral swing motion of the movable integrated portion upon movement in the Y direction.

The linear guide 46 that stabilizes the movement may be provided between the Y shaft fixed portion 42 or Z shaft fixed portion 52, and the connection portion 61 in the first embodiment. As described above, the second embodiment is different from the first embodiment in many aspects, which may accompany various changes. However, it does not have to make the entire structure different from the first embodiment.

The structure of the second embodiment other than those described above is the same as that of the ZY drive shaft 60A according to the first embodiment.

Figure 7:
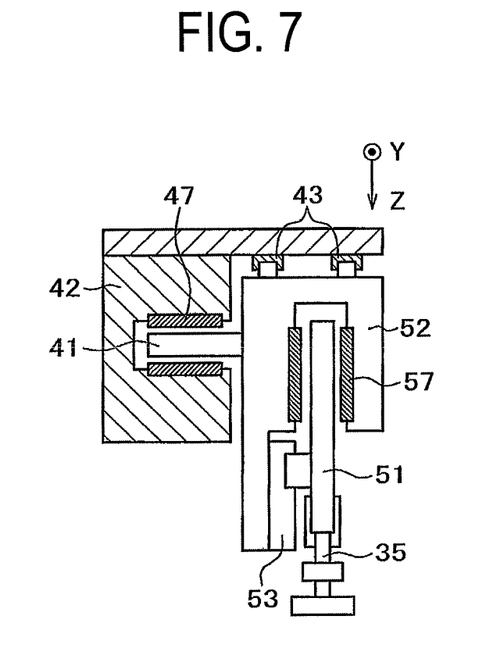
FIG. 7 is a view illustrating the two-shaft drive mechanism having the Z shaft as the load.

As for the ZY drive shaft 60B according to the second embodiment, the Z shaft fixed portion 52 as the weight object does not move by itself compared to the structure shown in FIG. 7 likewise the first embodiment. This may largely reduce the load to the movement in the Y direction, and ensures high speed operation of the elevating shaft without increasing the torque of the horizontal drive shaft.

As for the ZY drive shaft 60B according to the second embodiment, the Y shaft fixed portion linear guide 48 is provided so that the fixed integrated portion mainly formed of the Y shaft fixed portion 42 is freely movable. This makes it possible to suppress vibration by offsetting vibrations of the movable integrated portion and the fixed integrated portion, thus improving accuracy of positioning the bonding head 35.

In the explanation as described above, the bonding head is taken as an example of the processing unit. Basically, it is applicable to the processing unit that requires the two-shaft drive mechanism that needs the elevating shaft. For example, as for the die bonder, it is applicable to the needle used for applying the die adhesive agent to the substrate in the preform unit 31.

The embodiments according to the present invention have been described. It is to be understood that the present invention may be made into an alternative form, corrected, and modified based on the description. The present invention contains an alternative examples, correction or modification as described above within a scope of the present invention.

What is claimed is:

1. A two-shaft drive mechanism comprising:
   a processing unit;
   a first linear motor provided with a first movable portion and a first fixed portion, which elevates the processing unit along a first linear guide, and a second linear motor provided with a second movable portion and a second fixed portion, which moves the processing unit in a horizontal direction vertical to the direction for elevating the processing unit;
   a support body that fixes the first fixed portion;
   a second linear guide that is provided between the support body and the second fixed portion, and allows the second fixed portion to freely move as a counter weight in the Y direction;
   a linear sensor that detects a position of the first movable portion in a horizontal direction with respect to the support body; and
   a control unit that controls a position of the first movable portion in the horizontal direction based on an output of the linear sensor;
   wherein the second fixed portion moves inertially in directions opposite to directions of the support body.

2. The two-shaft drive mechanism according to claim 1, further comprising a connection portion that connects the first movable portion and the second movable portion directly or indirectly via the first linear guide, and a third linear guide that moves the first movable portion, the second movable portion and the connection portion integrally in the horizontal direction.

3. The two-shaft drive mechanism according to claim 2, wherein the first movable portion is provided in a direction vertical to the second movable portion, and the second linear guide and the third linear guide are provided parallel to each other.

4. The two-shaft drive mechanism according to claim 3, wherein the second linear guide is identical to the third linear guide.

5. The two-shaft drive mechanism according to claim 2, wherein the first movable portion is provided parallel to the second movable portion, and the first fixed portion is provided parallel to the second fixed portion.

6. The two-shaft drive mechanism according to claim 5, wherein a fourth linear guide is provided between the support body that fixes the second linear guide and the connection portion.

7. The two-shaft drive mechanism according to claim 2, wherein a magnet formed by arranging a plurality of pairs of N-poles and S-poles alternately on the first movable portion in the elevating direction is provided on a predetermined region in the horizontal direction.

8. A die bonder having a two-shaft drive mechanism, the two-shaft drive mechanism comprising:
   a processing unit processes with respect to a substrate;
   a first linear motor provided with a first movable portion and a first fixed portion, which elevates the processing unit along a first linear guide, and a second linear motor provided with a second movable portion and a second fixed portion, which moves the processing unit in a horizontal direction vertical to the direction for elevating the processing unit;
   a support body that fixes the first fixed portion;
   a second linear guide that is provided between the support body and the second fixed portion, and allows the second fixed portion to freely move as a counter weight in the Y direction;
   a linear sensor that detects a position of the first movable portion in a horizontal direction with respect to the support body; and
   a control unit that controls a position of the first movable portion in the horizontal direction based on an output of the linear sensor;
   wherein the second fixed portion moves inertially in directions opposite to directions of the support body.

9. The die bonder comprising according to claim 8, wherein the two-shaft drive further comprising a connection portion that connects the first movable portion and the second movable portion directly or indirectly via the first linear guide, and a third linear guide that moves the first movable portion, the second movable portion and the connection portion integrally in the horizontal direction.

10. The die bonder comprising according to claim 9, wherein the first movable portion is provided in a direction vertical to the second movable portion, and the second linear guide and the third linear guide are provided parallel to each other.

11. The die bonder comprising according to claim 10, wherein the second linear guide is identical to the third linear guide.

12. The die bonder comprising according to claim 9, wherein the first movable portion is provided parallel to the second movable portion, and the first fixed portion is provided parallel to the second fixed portion.

13. The die bonder comprising according to claim 12, wherein a fourth linear guide is provided between the support body that fixes the second linear guide and the connection portion.

14. The die bonder comprising according to claim 9, wherein a magnet formed by arranging a plurality of pairs of N-poles and S-poles alternately on the first movable portion in the elevating direction is provided on a predetermined region in the horizontal direction.

15. The die bonder according to claim 14, wherein the processing unit is a bonding head that picks up a die from a wafer, and bonds the die to the substrate.

16. The die bonder according to claim 15, wherein the predetermined region includes a pickup region and a bonding region.

17. The die bonder according to claim 8, wherein the processing unit is a needle used for applying a die adhesive agent to the substrate.

* * * * *